(12) United States Patent
Lutz, Jr. et al.

(10) Patent No.: US 6,239,672 B1
(45) Date of Patent: May 29, 2001

(54) WALL MOUNT FILTER FOR A DIGITAL SUBSCRIBER LINE (XDSL) NETWORK AND METHODS OF INSTALLATION AND MANUFACTURE

(75) Inventors: Ronald D. Lutz, Jr., Round Rock; Ronald E. Ham, Austin; James Randolph Sisk, Cedar Park, all of TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/106,653

(22) Filed: Jun. 29, 1998

(51) Int. Cl.[7] ........................................... H03H 7/01
(52) U.S. Cl. ..................... 333/175; 333/181; 333/185; 333/177; 379/399
(58) Field of Search .................. 333/12, 177, 181, 333/185, 175; 379/93.09, 399, 412; 439/620

(56) References Cited

U.S. PATENT DOCUMENTS

| | | | |
|---|---|---|---|
| 3,532,827 | 10/1970 | Ewin | 340/825.1 |
| 3,821,484 | 6/1974 | Sternung et al. | 370/384 |
| 4,002,849 | 1/1977 | Kotler et al. | 379/286 |
| 4,282,408 | 8/1981 | Stauers | 379/379 |
| 4,438,511 | 3/1984 | Baran | 370/204 |
| 4,647,725 | * 3/1987 | Dellinger et al. | 379/399 X |
| 4,665,514 | 5/1987 | Ching et al. | 370/392 |
| 4,679,227 | 7/1987 | Hughes-Hartogs | 379/93.31 |
| 4,723,267 | 2/1988 | Jones et al. | 379/93.05 |
| 4,731,816 | 3/1988 | Hughes-Hartogs | 379/93.31 |
| 4,757,495 | 7/1988 | Decker et al. | 370/477 |
| 4,782,512 | 11/1988 | Hutton | 379/93.28 |
| 4,823,383 | * 4/1989 | Cardot et al. | 379/412 |
| 4,833,706 | 5/1989 | Hughes-Hartogs | 379/93.31 |
| 4,841,561 | 6/1989 | Hill | 379/93.29 |
| 4,949,355 | 8/1990 | Dyke et al. | 375/224 |

(List continued on next page.)

FOREIGN PATENT DOCUMENTS

| | | |
|---|---|---|
| 62-084646 | 4/1987 | (JP) . |
| 62-222755 | 9/1987 | (JP) . |
| 63-76648 | 4/1988 | (JP) . |
| 02271763 | 11/1990 | (JP) . |
| 04100367 | 4/1992 | (JP) . |
| WO 86/02796 | 5/1986 | (WO) . |
| WO 97/37458 | 10/1997 | (WO) . |

OTHER PUBLICATIONS

Horst Hessenmüller, et al., Zugangsnetzstrukturen für interaktive Videodienste (Teil 1), *Fernmelde Ingenieur, Der*, vol. 48, No. 8, XP000647017, Aug., 1994, Germany, pp. 1–32 (with English translation).

Horst Hessenmüller, et al., Zugangsnetzstrukturen für interaktive Videodienste (Teil 2), *Fernmelde–Ingenieur*, vol. 48, No. 9, XP000619688, Sep., 1994, Germany, pp. 1–28 (with English translation).

*Primary Examiner*—Justin P. Bettendorf
(74) *Attorney, Agent, or Firm*—Baker Botts L.L.P.

(57) ABSTRACT

A wall mount filter for an xDSL network is provided. Wall mount filter includes a wall mount plate to which a connection port is coupled. The connection port is operable to electrically couple to an electronic device. A low pass filter circuit is coupled to a back surface of the wall mount plate. The low pass filter circuit is in electrical connection with the connection port. The low pass filter circuit is operable to electrically couple to a premises network and is sized to fit within a wall mount outlet. The wall mount plate is operable to be coupled to the wall mount outlet with a front surface facing outward and the low pass filter circuit contained within the wall mount outlet.

29 Claims, 1 Drawing Sheet

U.S. PATENT DOCUMENTS

| | | | |
|---|---|---|---|
| 4,980,897 | 12/1990 | Decker et al. | 375/265 |
| 5,025,469 | 6/1991 | Bingham | 379/100.17 |
| 5,054,034 | 10/1991 | Hughes-Hartogs | 375/222 |
| 5,119,402 | 6/1992 | Ginzburg et al. | 375/288 |
| 5,134,611 | 7/1992 | Steinka et al. | 370/466 |
| 5,185,763 | 2/1993 | Krishnan | 375/262 |
| 5,198,818 | 3/1993 | Samueli et al. | 341/144 |
| 5,199,071 | 3/1993 | Abe et al. | 379/93.34 |
| 5,202,884 | 4/1993 | Close et al. | 370/522 |
| 5,206,886 | 4/1993 | Bingham | 375/344 |
| 5,214,650 | 5/1993 | Renner et al. | 370/276 |
| 5,222,077 | 6/1993 | Krishnan | 375/261 |
| 5,228,062 | 7/1993 | Bingham | 375/344 |
| 5,247,347 | 9/1993 | Litteral et al. | 348/7 |
| 5,282,155 | 1/1994 | Jones | 708/322 |
| 5,285,474 | 2/1994 | Chow et al. | 375/231 |
| 5,293,402 | 3/1994 | Crespo et al. | 375/233 |
| 5,295,159 | 3/1994 | Kerpez | 375/260 |
| 5,331,670 | 7/1994 | Sorbara et al. | 375/362 |
| 5,337,348 | 8/1994 | Yamazaki et al. | 370/294 |
| 5,339,355 | 8/1994 | Mori et al. | 370/294 |
| 5,341,474 | 8/1994 | Gelman et al. | 709/206 |
| 5,345,437 | 9/1994 | Ogawa | 370/228 |
| 5,367,540 | 11/1994 | Kakuishi et al. | 375/350 |
| 5,371,532 | 12/1994 | Gelman et al. | 348/7 |
| 5,379,441 | 1/1995 | Watanabe et al. | 710/131 |
| 5,390,239 | 2/1995 | Morris et al. | 379/93.08 |
| 5,400,322 | 3/1995 | Hunt et al. | 370/468 |
| 5,404,388 | 4/1995 | Eu | 379/24 |
| 5,408,260 | 4/1995 | Arnon | 348/6 |
| 5,408,522 | 4/1995 | Ikehata et al. | 379/93.28 |
| 5,408,614 | 4/1995 | Thornton et al. | 710/21 |
| 5,410,264 | 4/1995 | Lechleider | 327/311 |
| 5,410,343 | 4/1995 | Coddington et al. | 348/7 |
| 5,414,455 | 5/1995 | Hooper et al. | 348/7 |
| 5,414,733 | 5/1995 | Turner | 375/233 |
| 5,422,876 | 6/1995 | Turudic | 370/249 |
| 5,428,608 | 6/1995 | Freeman et al. | 370/261 |
| 5,430,793 | 7/1995 | Ueltzen et al. | 379/93.29 |
| 5,440,335 | 8/1995 | Beveridge | 348/13 |
| 5,442,390 | 8/1995 | Hooper et al. | 348/7 |
| 5,453,779 | 9/1995 | Dan et al. | 348/7 |
| 5,461,415 | 10/1995 | Wolf et al. | 348/7 |
| 5,461,616 | 10/1995 | Suzuki | 370/438 |
| 5,461,640 | 10/1995 | Gatherer | 375/231 |
| 5,469,495 | 11/1995 | Beveridge | 379/56.2 |
| 5,475,735 | 12/1995 | Williams et al. | 455/403 |
| 5,477,263 | 12/1995 | O'Callaghan et al. | 348/7 |
| 5,479,447 | 12/1995 | Chow et al. | 375/260 |
| 5,495,483 | 2/1996 | Grube et al. | 370/341 |
| 5,504,736 | 4/1996 | Cubbison, Jr. | 370/241 |
| 5,504,753 | 4/1996 | Renger et al. | 371/20.1 |
| 5,506,868 | 4/1996 | Cox et al. | 375/222 |
| 5,513,251 | 4/1996 | Rochkind et al. | 379/93.35 |
| 5,528,585 | 6/1996 | Cooley et al. | 370/347 |
| 5,528,630 * | 6/1996 | Ashley et al. | 333/177 X |
| 5,546,379 | 8/1996 | Thaweethai et al. | 370/254 |
| 5,555,244 | 9/1996 | Gupta et al. | 370/397 |
| 5,574,724 | 11/1996 | Bales et al. | 370/68.1 |
| 5,583,872 | 12/1996 | Albrecht et al. | 370/476 |
| 5,598,406 | 1/1997 | Albrecht et al. | 370/296 |
| 5,600,712 | 2/1997 | Hanson et al. | 379/142 |
| 5,602,902 | 2/1997 | Satterlund et al. | 455/553 |
| 5,631,897 | 5/1997 | Pacheco et al. | 370/237 |
| 5,632,021 | 5/1997 | Jennings et al. | 710/129 |
| 5,649,001 | 7/1997 | Thomas et al. | 379/93.07 |
| 5,668,857 | 9/1997 | McHale | 379/93.07 |
| 5,678,004 | 10/1997 | Thaweethai | 713/201 |
| 5,687,176 | 11/1997 | Wisniewski et al. | 370/476 |
| 5,687,233 * | 11/1997 | Loudermilk et al. | 333/185 X |
| 5,737,364 | 4/1998 | Cohen et al. | 375/220 |
| 5,751,710 | 5/1998 | Crowther et al. | 370/423 |
| 5,756,280 | 5/1998 | Soora et al. | 455/4.2 |
| 5,770,950 | 6/1998 | Zurcher et al. | 326/30 |
| 5,781,617 | 7/1998 | McHale et al. | 379/93.14 |
| 5,793,987 | 8/1998 | Quackenbush et al. | 710/100 |
| 5,799,017 | 8/1998 | Gupta et al. | 370/419 |
| 5,812,786 | 9/1998 | Seazholtz et al. | 700/233 |
| 5,848,150 * | 12/1998 | Bingel | 379/93.09 X |
| 5,852,655 | 12/1998 | McHale et al. | 379/93.14 |
| 6,026,160 * | 2/2000 | Staber et al. | 379/399 |

\* cited by examiner

WALL MOUNT FILTER FOR A DIGITAL SUBSCRIBER LINE (XDSL) NETWORK AND METHODS OF INSTALLATION AND MANUFACTURE

TECHNICAL FIELD OF THE INVENTION

The present invention relates in general to the field of digital subscriber line (xDSL) network filters and, more particularly, to a wall mount filter for a digital subscriber line (xDSL) network and methods of installation and manufacture.

BACKGROUND OF THE INVENTION

The Public Switched Telephone Network (PSTN) was originally designed for carrying analog voice communication signals. However, users are increasingly using the PSTN to transmit digital data. A typical PSTN network includes numerous central offices. Communication between the central offices can be accomplished through high speed switched digital links. Local loops couple the central offices to the customer premises. The local loops can be analog networks of twisted pair copper wiring. These analog local loops are often referred to as the Plain Old Telephone System (POTS). A "customer premises network", "premises network", or "premises wiring" typically connects electronic devices within the customer premises to the local loop. For example, a typical premises network can comprise twisted pair wiring coupled to RJ-11 phone jacks.

The central office typically includes, among other elements, a bandpass filter that can limit the bandwidth of the local loop to approximately 3.3 kHz (between 300 Hz and 3.4 kHz). This is done so that numerous voice-grade local loop lines can be digitized and multiplexed together for transmission between central offices over the switched digital links.

Current computing environments necessitate the need for digital transmission of data. Several services such as leased or switched lines enable such data traffic, but can be prohibitively expensive. Similarly, replacing the telephone infrastructure with a medium that is more conducive to digital traffic can also be prohibitively expensive. Therefore, users desire to use POTS lines to transmit digital data.

Conventional modem technology is one such method of transmitting digital data over POTS lines. This technology attempts to transmit high speed data over POTS lines within the limits of the allocated voice bandwidth, or below 3.4 kHz.

Digital Subscriber Line (xDSL) technology, on the other hand, can apportion the transmission of data over POTS lines into a voice channel and a digital channel. The voice channel can include signals below 4 kHz while the digital channel can include signals above 4 kHz. As such, xDSL can provide a method to increase the bandwidth of the existing telephone network infrastructure. Furthermore, xDSL technology can allow conventional electronic devices that use the voice channel, and xDSL devices such as transceivers, to couple to the same POTS network. Furthermore, the conventional devices and the xDSL devices can communicate simultaneously over the same wiring, using the respective channels. To accomplish this task, splitters or filters can be used to separate the two channels. Typically, a splitter or filter is placed both at the central office and the customer premises of an xDSL network.

One conventional filter architecture used at the customer premises end of an xDSL network is a distributed filter. With a distributed filter architecture, a low pass filter is coupled between the premises network and each electronic device that uses signals in the voice channel. For example, each telephone, facsimile machine, and other conventional telephony device would be coupled first to a low pass filter which would then be coupled to the telephone network of the customer premises (e.g., via a standard telephone line). Each low pass filter allows signals in the voice channel to travel to and from the conventional devices, while filtering out traffic and noise that can be caused by devices using the digital channel. In this scheme, devices using the digital channel, such as xDSL transceivers, can connect directly into the premises network.

Conventional distributed filter systems typically couple a box containing a low pass filter between a wall mount outlet and each conventional electronic device. However, such conventional systems can be disadvantageous because they involve an additional piece of electronic equipment. Such equipment can be positioned in the open, and can be interfered with, for example, by passing foot traffic. Such conventional systems can also require additional monitoring to ensure that the low pass filter box does not become uncoupled from the wall mount outlet.

SUMMARY OF THE INVENTION

In accordance with the present invention, a wall mount filter for a digital subscriber line network and methods of installation and manufacture are disclosed that provide significant advantages over prior developed filter systems.

According to one aspect of the present invention, the wall mount filter includes a wall mount plate having a front surface and a back surface. A connection port is coupled to the front surface of the wall mount plate. The connection port is operable to electrically couple to an electronic device. The filter also includes a low pass filter circuit coupled to the back surface of the wall mount plate. The low pass filter circuit is in electrical connection with the connection port and is operable to be electrically coupled to a premises network. The wall mount plate is operable to couple to a wall mount outlet with the front surface outward and the low pass filter circuit contained inside the wall mount outlet.

It is a technical advantage of the present invention that the wall mount filter allows voice and digital traffic in an xDSL network to travel on the same premises network without the need for an additional device coupled between a wall mount outlet and a conventional electronic device.

It is a further technical advantage of the present invention that the risk of a conventional electronic device being uncoupled from the premises network is reduced.

Other technical advantages should be apparent to one of ordinary skill in the art in view of the specification, claims and drawings.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
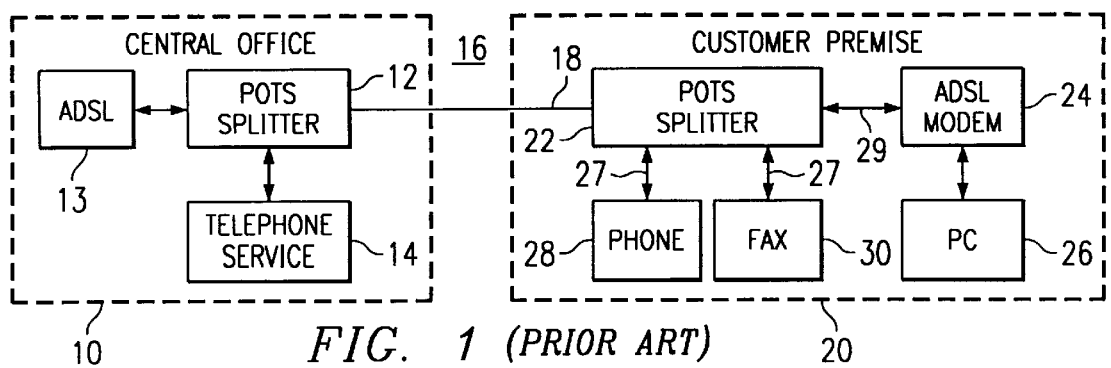
FIG. 1 is a block diagram of one embodiment of a conventional ADSL installation with a centralized POTS splitter.

FIG. 1 is a block diagram of one embodiment of a conventional ADSL installation with a centralized POTS splitter. Although this discussion is with respect to Asymmetric Digital Subscriber Line (ADSL) technology, it should be understood that the present invention can be used with other current or future Digital Subscriber Line (collectively xDSL) technologies.

In the embodiment of FIG. 1, a central office 10 is coupled to a customer premises 20 through the Plain Old Telephone System ("POTS") telephone network 16. Central office 10 comprises a POTS splitter 12 coupled to POTS network 16. POTS splitter 12 can split the signal on POTS network 16 into ADSL traffic 13 and regular telephone service traffic 14. For example, regular telephone service traffic 14 could comprise signals below 4 kHz, while ADSL traffic 13 could comprise signals above 4 kHz.

At customer premises 20, POTS network 16 is coupled to premises network 18. POTS splitter 22 can separate signals on premises network 18 into regular telephone service traffic 27 and ADSL traffic 29. ADSL modem 24 can communicate using ADSL traffic 29 and can be coupled, for example, to personal computer 26. Electronic devices such as phone 28 and fax 30 can communicate using regular telephone service traffic 27 from POTS splitter 22. POTS splitter 12 and POTS splitter 22 can be, for example, passive filters.

In operation, the ADSL protocol separates the available bandwidth on POTS network 16 into a voice band, below 4 kHz, and a digital band, between 4 kHz and 2 MHz. With such an installation, a normal telephone conversation can be held while simultaneously transmitting or receiving digital data over the same telephone line. Referring to FIG. 1, a user can use phone 28 to carry on a conversation while simultaneously using personal computer 26 and ADSL modem 24 to communicate with other devices, for example, over the Internet.

Figure 2:
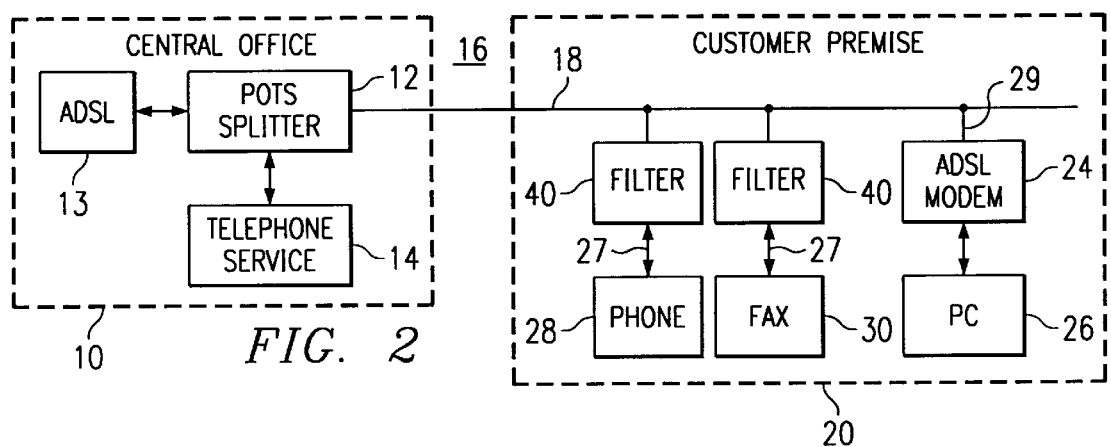
FIG. 2 is a block diagram of one embodiment of an ADSL installation with a distributed POTS filter using one embodiment of a wall mount filter according to the present invention.

FIG. 2 is a block diagram of one embodiment of an ADSL installation with a distributed POTS filter using one embodiment of a wall mount filter according to the present invention. As shown, central office 10 can comprise a POTS splitter 12 which separates traffic on POTS network 16 into regular telephone service traffic 14 and ADSL traffic 13. Central office 10 is coupled to premises network 18 of customer premises 20 through POTS network 16. However, unlike the installation of FIG. 1, in FIG. 2, a distributed filter mechanism is employed. This mechanism involves wall mount filters 40 which are coupled between regular equipment, such as phone 28 and fax 30, and premises network 18. In this scheme, ADSL modem 24 does not require a filter and can couple directly to premises network 18 and personal computer 26.

In operation, wall mount filters 40 of FIG. 2 can perform an analogous function as POTS splitter 22 of FIG. 1. In particular, wall mount filters 40 can split regular telephone service traffic 27 from ADSL traffic 29. In FIG. 2, wall mount filter 40 can accomplish the split by filtering out ADSL traffic 29 from premises network 18. For example, wall mount filters 40 can each include a low pass filter circuit that filters out signals over 4 kHz. In such a manner, wall mount filters 40 can maintain backward compatibility between ADSL network and POTS. Further, such an installation can avoid disruption of service due to faults in ADSL equipment, such as ADSL modem 24. Wall mount filters 40 can additionally prevent the impedance of phone 28 and fax 30 from harming the ADSL transceiver on ADSL modem 24. Furthermore, wall mount filters 40 can prevent noise created by ADSL traffic 29 from interfering with the operation of phone 28 and fax 30.

Figures 3A, 3B, 3C:
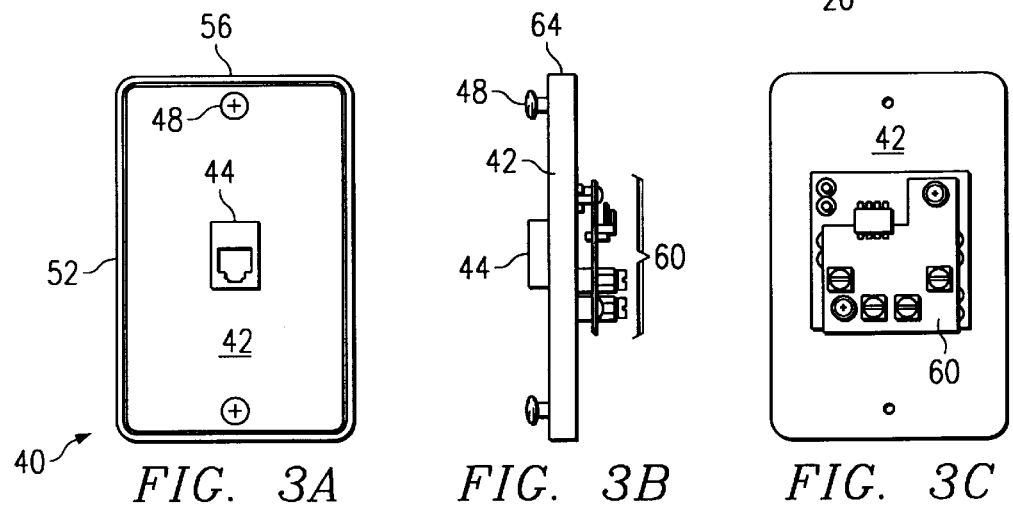
FIGS. 3A, 3B, and 3C are front, side, and back views of one embodiment of a wall mount filter according to the present invention.

FIGS. 3A, 3B, and 3C are front, side, and back views of one embodiment of a wall mount filter according to the present invention. As shown in FIG. 3A, the wall mount filter, indicated generally at 40, includes a wall mount plate 42. A connection port 44 is coupled to a front surface of wall mount plate 42. In the embodiment of FIG. 3A, connection port 44 is a female RJ-11 telephone jack. Screws 48 can couple wall mount filter 40 to a wall mount outlet. A wall mount outlet is a fixture at customer premises 18 at which a connection to premises network 18 is made available. Wall mount plate 42 can have, for example, a side 52 with a dimension of approximately 4.72 inches and a side 56 of a dimension of approximately 2.98 inches. Such dimensions can enable wall mount filter 40 to be coupled to "standard" wall mount outlets that are the conventional place of connection to a premises network.

FIG. 3B is a side view of wall mount filter 40 of FIG. 3A. As mentioned, wall mount filter 40 includes a wall mount plate 42 and connection port 44. Screws 48 operate to couple wall mount filter 40 to a wall mount outlet. In the embodiment of FIG. 3B, wall mount plate 42 has a depth 64 with a dimension of approximately 0.35 inches. Wall mount filter 40 further includes a low pass filter circuit 60 coupled to a back surface of wall mount plate 42. Low pass filter circuit 60 is electrically coupled to connection port 40. Low pass filter circuit 60 is also operable to electrically couple to premises network, such as standard phone wiring that can exist in conventional premises networks. In the embodiment of FIG. 3B, low pass filter circuit 60 extends approximately 0.615 inches from wall mount plate 42.

FIG. 3C is a rear view of wall mount filter 40 of FIGS. 3A and 3B. As mentioned above, wall mount plate 42 has a back surface upon which low pass filter circuit 60 is coupled. Low pass filter circuit 60 is sized to fit inside and be contained within a wall mount outlet.

In operation, wall mount filter 40 of FIGS. 3A–3C can be coupled to a wall mount outlet with low pass filter circuit 60 connected to the premises network. Once installed, low pass filter circuit 60 can fit inside the wall mount outlet and thus is not seen by a user. Connection port 44 then faces outward towards the user for receiving connections from electronic devices. Regular phone equipment, such as a phone or facsimile machine, can be connected, for example using an RJ-11 connection, to connection port 44. The dimensions of sides 52, 56 and depth 64 of wall mount plate 42 can be configured such that wall mount filter 40 can be installed without modification to an existing wall mount outlet. After installation, low pass filter 60 is electrically coupled between connection port 44 and premises network. Low pass filter circuit 60 can operate to prevent a device coupled to port 44 from interfering with or being interfered with by ADSL traffic on the premises network. In such a manner, wall mount filter 40 can provide an easily installed and effective distributed POTS filter for ADSL communication at the customer premises.

Figures 4A, 4B:
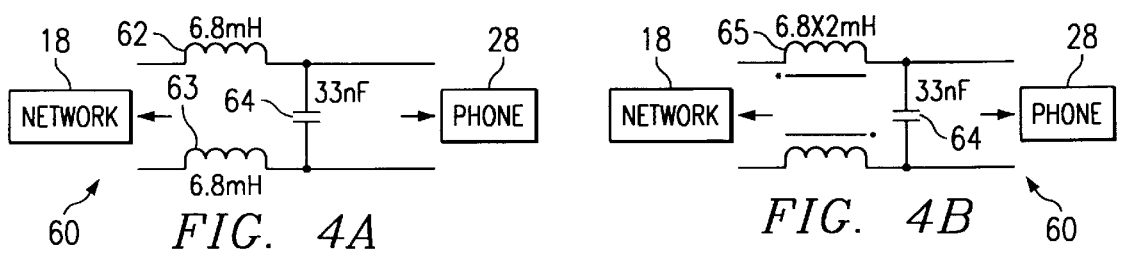
FIGS. 4A and 4B are circuit diagrams of different embodiments of a low pass filter circuit of a wall mount filter according to the present invention.

FIGS. 4A and 4B are circuit diagrams of different embodiments of a low pass filter circuit of a wall mount filter according to the present invention. In the embodiment of FIG. 4A, inductor 62 and inductor 63 are connected to two separate wires of a premises network 18. For example, the two wires could comprise the tip and ring wires of a POTS telephone line. Capacitor 64 is connected between inductor 62 and inductor 63, as shown. An electronic device such as a phone 28 can be connected in parallel to capacitor 64, for example using an RJ-11 connection. In one implementation of the circuit of FIG. 4A, inductors 62 and 63 each have an inductance of 6.8 mH, and capacitor 64 has a capacity of 33 nF.

The circuit of FIG. 4B is an alternate embodiment to the circuit of FIG. 4A. In FIG. 4B, low pass filter circuit 60 comprises a coupled inductor 65 and a capacitor 64. As shown, two wires of premises network 18 are connected to a first pair of terminals of coupled inductor 65, and capacitor 64 is connected across a second pair of terminals of coupled inductor 65. An electronic device such as phone 28 can then couple in parallel to capacitor 64. In one implementation of the circuit of FIG. 4B, coupled inductor 65 has an inductance of 6.8 mH×2, and capacitor 64 has a capacitance of 33 nF.

In operation, low pass filter circuit 60 of FIGS. 4A and 4B can isolate phone 28 from higher frequency ADSL traffic on premises network 18. Low pass filter circuit 60 can allow signals below 4 kHz to pass between premises network 18 and phone 28, and can block signals having frequencies above 4 kHz. Further, low pass filter circuit 60 can present an appropriate impedance matched to premises network 18. For example, low pass filter circuit 60 can exhibit a maximum resistance to network 18 of approximately 25 ohms. In addition, low pass filter circuit 60 can exhibit a maximum attenuation distortion, for example, of approximately 1 dB relative to a 1 kHz signal between 300 Hz and 3.4 kHz. Those skilled in the art will recognize that the low pass filter circuits 60 of FIGS. 4A and 4B are two possible methods of performing the low pass filter operation. The present invention contemplates that alternate methods of performing the low pass filter function can be used rather than the low pass filter circuits 60. For example, an active circuit could be used to perform an equivalent function.

Although the present invention has been described in detail, it should be understood that various changes, substitutions and alterations can be made thereto without departing from the spirit and scope of the invention as defined by the appended claims.

What is claimed is:

1. An apparatus for connecting an electronic device to an xDSL network, the apparatus comprising:
   a plate having a connection port operable to be coupled to a connector associated with the electronic device; and
   a filter coupled to the plate and the connection port, the filter operable to be continuously connected to the xDSL network, the filter operable to filter signals about four kilohertz and above, wherein the filter is in direct communication with the xDSL network.

2. The apparatus as recited in claim 1, wherein the filter further comprises:
   an input operable to be directly coupled to a premises network; and
   an output operable to be coupled to the connection port.

3. The apparatus of claim 1, wherein the filter is operable to isolate an impedance associated with the electronic device from the xDSL network.

4. The apparatus of claim 3, wherein the filter is operable to filter a signal about four kilohertz and above in response to the signal being communicated by the xDSL network.

5. The apparatus of claim 1, wherein the filter continuously filters signals about four kilohertz and above in response to the signals being communicated.

6. The apparatus of claim 1, wherein the filter is operable to isolate the electronic device from an ADSL device.

7. The apparatus of claim 1, wherein the filter further comprises:
   a first inductor operable to be directly coupled between the xDSL network and the connector;
   a second inductor operable to be directly coupled between the xDSL network and the connector; and
   a capacitor coupled between the first and second inductors.

8. The apparatus of claim 7, wherein the xDSL network comprises a POTs telephone line.

9. An apparatus for connecting an electronic device to an xDSL network, the apparatus comprising:
   a wall mount plate having a front surface and a back surface;
   an RJ-11 connector coupled to the plate, the connector operable to electrically couple the electronic device; and
   a filter coupled to the back surface of the plate, the filter comprising:
      a first inductor operable to be directly coupled between the xDSL network and the RJ-11 connector;
      a second inductor operable to be directly coupled between the xDSL network and the RJ-11 connector;
      a capacitor coupled between the first and second inductors; and
      wherein the low pass filter is operable to filter signals about four kilohertz and above, the filter exhibits a maximum attenuation distortion of approximately 1 dB, relative to a 1 kHz signal, between 300 Hz to 3.4 kHz.

10. The apparatus of claim 9, wherein the wall mount plate has dimensions of approximately 4.72 inches by 2.98 inches by 0.35 inches.

11. The apparatus of claim 9, wherein each inductor has an inductance of 6.8 mH.

12. The apparatus of claim 9, wherein the capacitor has a capacitance of 33 nF.

13. The apparatus of claim 9, wherein the filter exhibits a maximum DC resistance to the connection port of approximately 25 ohms.

14. A premises network for connecting a plurality of network devices, the premises network comprising:
   at least one xDigital Subscriber Line (xDSL) operable to communicate at least one signal;
   at least one xDSL connection coupled to the xDSL, the xDSL connection operable to communicate an xDSL signal to an xDSL device;
   a plurality of wall mount plates coupled to the xDSL, the wall mount plates comprising:
      an output port operable to couple an electronic device;
      an input port coupled to the xDSL;
      a low pass filter directly coupled between the input port and the output port and to a back surface of one of the wall mount plates; and
      the low pass filter continuously connected to the xDSL, wherein the filter is operable to be in continuous communication with the network.

15. The network of claim 14, wherein the low pass filter is operable to filter signals about four kilohertz and above.

16. The network of claim 14, wherein the output port comprises an RJ-11 connector.

17. The network of claim 14, wherein the low pass filter is operable to isolate the electronic device from the xDSL device.

18. A method of installing a wall mount filter for an xDSL network, the method comprising:

providing a wall mount plate comprising:
- a plate having a connection port operable to be coupled to a connector associated with the electronic device;
- a filter coupled to the plate and the connection port, the filter operable to be continuously connected to the xDSL network, the filter operable to filter signals about four kilohertz and above; and coupling the wall mount plate to a wall mount outlet such that the front surface faces outward and the low pass filter circuit wall mount outlet.

19. The method claim 18, wherein the connection port comprises a female RJ-11 connector.

20. The method of claim 18, wherein the filter exhibits a maximum DC resistance to the connection port of approximately 25 ohms.

21. The method claim 18, wherein the filter exhibits a maximum attenuation distortion of approximately 1 dB, relative to a 1 kHz signal, between 300 Hz to 3.4 kHz.

22. The method of claim 18, wherein the coupling further comprises:

connecting a first conductor associated with the xDSL network to a first inductor associated with the filter; and connecting a second conductor associated with the network to a second inductor associated with the low pass filter.

23. A method of manufacture of an apparatus for connecting a device to an xDSL network, the method comprising:

providing a wall mount plate having a front surface and a back surface;

coupling a connection port to the front surface of the wall mount plate, the connection port operable to electrically couple to an electronic device; and coupling a low pass filter circuit to the back surface of the wall mount plate, the low pass filter circuit in electrical connection with the connection port, and the low pass filter circuit operable to be continuously connected between the xDSL network and the connection port; and the low pass filter circuit sized to fit within a wall mount outlet, wherein the low pass filter circuit exhibits a maximum attenuation distortion of approximately 1 dB, relative to a 1 kHz signal, between 300 Hz to 3.4 kHz.

24. The method of claim 23, wherein the connection port comprises a female RJ-11 connector.

25. The method of claim 23, wherein the low pass filter circuit exhibits a maximum DC resistance to the connection port of approximately 25 ohms.

26. The method of claim 23, wherein the wall mount plate has dimensions of approximately 4.72 inches by 2.98 inches by 0.35 inches.

27. The method of claim 23, wherein the low pass filter circuit extends approximately 0.615 inches from the back surface of the wall mount plate.

28. An apparatus for connecting an electronic device to an xDSL network, the apparatus comprising:

means for coupling a connection port to a wall mount plate, the connection port operable to be coupled to a connector associated with the electronic device;

means for communicating with the xDSL network, the communicating including filtering signals about four kilohertz and above;

means for continuously filtering signals about four kilohertz and above;

means for directly coupling a filter to the xDSL network; and means for directly coupling the filter to the connection port.

29. The apparatus as recited in claim 28, further comprising means for isolating the electronic device from an ADSL device.

* * * * *